US006091201A

United States Patent [19]

Walsh et al.

[11] Patent Number: 6,091,201

[45] **Date of Patent: *Jul. 18, 2000**

[54] METHOD AND APPARATUS FOR ACCOMMODATING MULTIPLE DIMMING STRATEGIES

[75] Inventors: Kathleen Ann Walsh, Farmington Hills; Gregory E. Palarski, Livonia, both of Mich.

[73] Assignee: Ford Motor Company, Dearborn, Mich.

[ * ] Notice: This patent issued on a continued prosecution application filed under 37 CFR 1.53(d), and is subject to the twenty year patent term provisions of 35 U.S.C. 154(a)(2).

[21] Appl. No.: 08/684,775

[22] Filed: Jul. 22, 1996

[51] Int. Cl.[7] .......................... H03K 5/22

[52] U.S. Cl. .................. 315/169.1; 326/104; 315/307; 315/208

[58] Field of Search ................ 326/104, 94, 111, 326/113, 105, 125; 315/169.1, 307, 208, DIG. 2, 292

[56] References Cited

U.S. PATENT DOCUMENTS

| | | | |
|---|---|---|---|
| 2,731,631 | 1/1956 | Spaulding | 326/105 |
| 2,843,837 | 7/1958 | Thaler et al. | 326/111 |
| 3,040,259 | 6/1962 | Groudan et al. | 326/105 |
| 3,192,480 | 6/1965 | Clayton | 326/105 |
| 4,495,445 | 1/1985 | Turney | 315/169.1 |
| 4,605,871 | 8/1986 | Price et al. | 326/125 |
| 4,859,912 | 8/1989 | Lippmann et al. | 315/169.1 |
| 4,968,917 | 11/1990 | Harris | 315/169.1 |
| 5,155,413 | 10/1992 | Bozzer et al. | 315/169.1 |
| 5,334,914 | 8/1994 | Dean et al. | 315/291 |
| 5,339,009 | 8/1994 | Lai | 315/291 |
| 5,402,042 | 3/1995 | Madsen | 315/169.1 |

OTHER PUBLICATIONS

Weissman Computer Software a Patentable Subject Matter Contrasting United States, Japanese and European Laws AIPLA Quarterly vol. 23, #3 pp 525, 1995.

*Primary Examiner*—Robert J. Pascal
*Assistant Examiner*—Michael Shingleton
*Attorney, Agent, or Firm*—Mark L. Mollon

[57] ABSTRACT

An input circuit for a dimming circuit control unit having a single input signal protocol includes a first input line to receive a first input voltage signal and a second input line to receive a second input voltage signal. A first voltage divider is electrically connected to the first input line to receive the first input voltage signal and to divide the first voltage of the first input voltage signal. A second voltage divider is electrically connected to the second input line to receive the second input voltage signal and to divide a second voltage of the second input voltage signal. An inverter is connected to the first voltage divider to invert the first input voltage signal. An analog to digital converter is electrically connected to the first voltage divider to convert the first voltage when the first input signal is analog such that the dimming circuit control unit always receives a digital signal having the single input protocol.

13 Claims, 3 Drawing Sheets

METHOD AND APPARATUS FOR ACCOMMODATING MULTIPLE DIMMING STRATEGIES

BACKGROUND OF THE INVENTION

1. Field of the Invention

The present invention relates to dimmers, and more particularly, to a method and apparatus for accommodating the dimming of a display and/or lamp regardless of the dimming strategy used by the host motor vehicle.

2. Description of the Related Art

Automobiles and other vehicles are generally provided with electronic indicating panels on dashboards and the like which are controlled by driving circuits. These vehicles are similarly equipped with audio systems which have respective electronic indicators used for tuning, station identification, volume control and similar adjustments by the user.

These electronic indicators have typically been provided with means to adjust the intensity of the vacuum-fluorescent display and/or illuminating lamps, if any, in accordance with the ambient lighting conditions, the running condition of the vehicle and the user preferences. For example, when the vehicle is being operated in areas of high external illumination such as in urban districts, it may desirable to increase the intensity of the illumination of the display and/or illuminating lamps, so that the visibility of instruments may be increased. Similarly, when the vehicle is operated on less frequently traveled routes, it may be desirable to decrease the intensity of illumination of the illuminating lamp or lamps to prevent the distraction or fatigue to the operator or user.

An additional problem with displays and/or illuminating lamps occurs in audio systems which are typically designed without knowing the specific dimming strategy for the host motor vehicle. U.S. Pat. No. 5,339,009 issued to Lai discloses a method and apparatus for distinguishing input signals to generate a common dimming signal. The apparatus converts a signal once it is passed through an optoisolator where it is converted from an analog to a digital signal. Once the signal has been converted, sampling processes are used to determine the common dimming signal required to dim a lamp or series of lamp lines. This disclosure does not, however, disclose a solution to the problem of creating a dimming circuit which can universally receive and accommodate different types of signals and dim a lamp appropriately based on the input signal regardless of the type of signal.

SUMMARY OF THE INVENTION

A method for a dimming a display includes the step of receiving a signal. The method also includes the step of detecting an edge in the signal. A subsequent edge in the signal is also detected. A pulse width is calculated and defined by the edge and the subsequent edge. A duty cycle is calculated and identified by the pulse width. A dimming factor is determined to be used to dim the display.

An input circuit is used with the dimming strategy for dimming a display and/or lamp. The input circuit includes a first input line to receive a first input voltage signal. A first voltage divider is electrically connected to the first input line to receive the first input voltage signal and divides the first voltage of the first input voltage signal. The first voltage divider has a first output terminal. The input circuit includes a second input line to receive a second input voltage signal. A second voltage divider is electrically connected to the second input line to receive the second input voltage signal. The second voltage divider divides a second voltage of the second input voltage signal. The second voltage divider has a second output terminal. An OR terminal is connected to the first output terminal and the second output terminal. An inverter is connected between the first voltage divider and the OR terminal to invert the first input voltage signal to eliminate one signal polarity to be received by the dimming circuit control unit.

One advantage of the present invention is the ability to accommodate many types of dimming modules with no hardware changes or option straps. Another advantage associated with the present invention is the accommodation of many types of dimming modules without software changes or reconfigurations. Yet another advantage associated with the present invention is the reduced cost in the manufacturing of the circuit based on the simplicity and uniformity of the input circuit. Still another advantage associated with the present invention is the ability to provide more combinations of audio systems and vehicles based on the increased compatibility of each system using the present invention.

Other features and advantages of the present invention will be readily appreciated as the same becomes better understood after reading the subsequent description taken in conjunction with the accompanying drawings.

DESCRIPTION OF THE PREFERRED EMBODIMENT(S)

Figure 1:
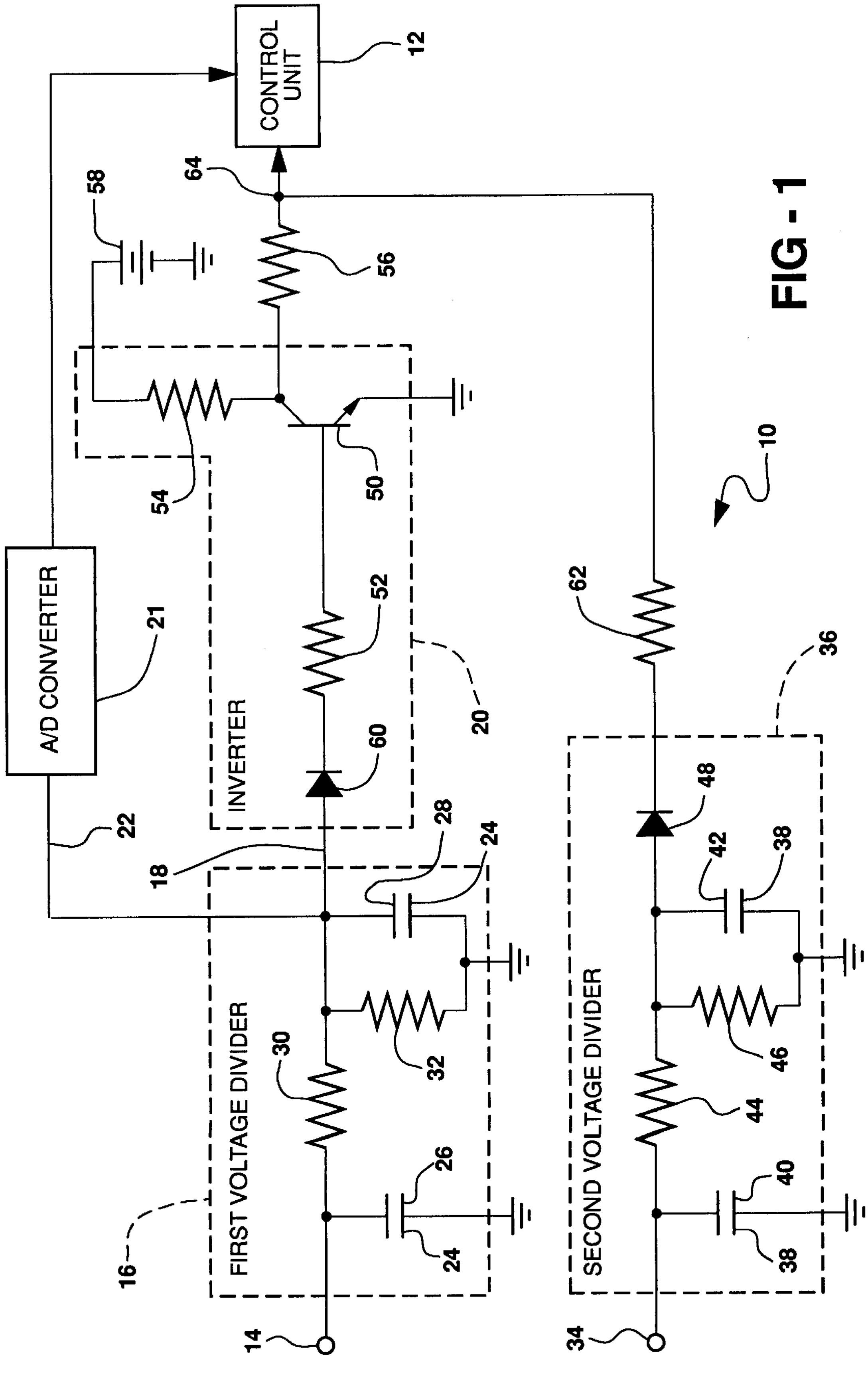
FIG. 1 is schematic diagram of one embodiment of the input circuit according to the present invention.

Referring to FIG. 1, an input circuit 10 for a control unit 12 which is used to control the dimming of a vacuum-fluorescent display and/or lamps (not shown) is generally indicated. The input circuit 10 is capable of receiving three different types of signals. These three different types of signals are potential dimming strategies which are currently used in motor vehicles today. The first type of signal is an analog signal. This analog is created by a rheostat (not shown). The rheostat generates an analog DC voltage signal between the ranges of four volts and the maximum voltage provided by the battery of the motor vehicle (not shown). This maximum voltage may ideally vary between twelve and fourteen volts, depending on the condition of the battery. The voltage of the DC signal would be at a level which is dependent upon a setting made by the user. Maximum brightness of the lamps is indicated by the voltage of the analog signal being close to the maximum voltage provided by the battery. Minimum brightness is indicated when the analog signal has a voltage approximately 4.5 volts.

A second type of signal receivable by the input circuit 10 is a positive pulse-width modulation signal. In this situation, a signal having a pulse train indicates the brightness level of the lamps. In this situation, the brightness of the lamp is directly proportional to the duty cycle of the pulse train.

The third type of signal receivable by the input circuit is a negative pulse-width modulated signal. In this situation, the brightness of the lamps is inversely proportional to the duty cycle of the pulse train modulated signal. In any given motor vehicle, only one of the three options is available. Therefore, it is desirable to create a dimming circuit which may accommodate any one of these three options.

The input circuit 10 includes a first input line 14 which receives one of the three abovementioned signals. With the analog signal, the first input line 14 receives the analog signal. With the positive pulse-width modulated signal, the first input line also receives the signal. In the third situation, however, the first input line 14 maintains the voltage level of the battery of the motor vehicle.

A first voltage divider 16 is electrically connected to the first input line 14 to receive the first input voltage signal, regardless of the type of signal, and divides a first voltage of the first input voltage signal. The first voltage divider 16 has a first output terminal 18. The first output terminal 18 is connectable to an inverter 20, discussed subsequently, and an input line 22 to an analog-to-digital converter 21. The analog-to-digital converter 21 is used to convert the analog signal created by the rheostat into a digital signal, the output of which is sent to the control unit 12 to determine the dimming level of the lamps. It may be appreciated by those skilled in the art that the analog-to-digital converter 21 may be integrated into the control unit 12.

The first voltage divider 16 includes a first capacitive unit 24 which includes a first capacitor and second capacitor 26,28. The first 26 and second 28 capacitors are used to limit the frequencies transmitted through the first voltage divider 16 and to suppress any transients which may be received through the first input line 14. The first capacitor 26 is connected between the first input line 14, ground, and a first resistor 30. The second capacitor 28 is connected between the first resistor 30, the first output terminal 18, a second resistor 32 and ground. The first resistor 30 is connected between the first input line 14, the first capacitor 26, the second resistor 32, the second capacitor 28, and the first output terminal 18.

The input circuit 10 also includes a second input line 34 which receives a second input voltage signal. In the situations where the input circuit 10 is connected to a system which produces either the analog signal or the positive pulse-width modulated signal, the second input line 34 is connected to a zero volt source. In the situation where the input circuit 10 is connected to a system using the negative pulse-width modulated signal strategy, the second input line 34 receives the negative pulse-width modulated signal. In this situation, the first input line 14 is connected to the battery.

A second voltage divider 36 is connected to the second input line 34. The second voltage divider 36 includes a second capacitive unit 38 which, similar to the first capacitive unit 24, limits the frequencies passed therethrough as well as suppresses all transients passed therethrough also. The second capacitive unit 38 includes a third capacitor 40 and a fourth capacitor 42. The second voltage divider 36 also includes a third resistor 44 and a fourth resistor 46. The third resistor 44 is connected to the second input line 34, the third capacitor 40, the fourth resistor 46, the fourth capacitor 42, and a first diode 48. The first diode 48 is used to insure proper logic levels. The first diode 48 is a type of interface between the second voltage divider 36 and the control unit 12. The third capacitor 40, the fourth capacitor 42, and fourth resistor 46 are all connected to ground.

The inverter 20 receives the signal from the first input line 14 after it has been divided by the first voltage divider 16. The inverter 20 is connected to the first output terminal 18 of the first voltage divider 16. The inverter 20 inverts the signal received by the first input line so that the control unit 12 perceives the positive pulse-width module it signal as a negative pulse-width modulated signal. This inverter 20 greatly reduces the amount of controls required by the control unit 12 because it effectively combines two of the strategies used to dim lamps.

The inverter 20 includes a transistor 50 with the emitter thereof connected to ground. The base of the transistor 50 is connected to a fifth resistor 52. The collector of the transistor 50 is connected to a sixth resistor 54 and a seventh resistor 56. The sixth resistor 54 is connected to a five voltage DC power source 58. A second diode 60 is connected in series between the fifth resistor 52 and the first output terminal 18 of the first voltage divider 16. The second diode 60 is necessary to insure that the transistor 50 turns off completely when the positive pulse-width modulated signal is low.

The output of the inverter 20 is loaded with the seventh resistor 56 to provide a proper logic level for the control unit 12. In one embodiment, the control unit 12 operates using CMOS logic. Also, an eighth resistor 62 is connected between the second voltage divider 36 and the control unit 12 to insure proper logic levels are received by the control unit 12.

An OR terminal 64 is connected between the seventh resistor 56 and the eight resistor 62 and the control unit 12. The OR terminal is a wired-OR terminal and provides a single input for the control unit 12 from the first input line 14 and the second input line 34.

Figure 2:
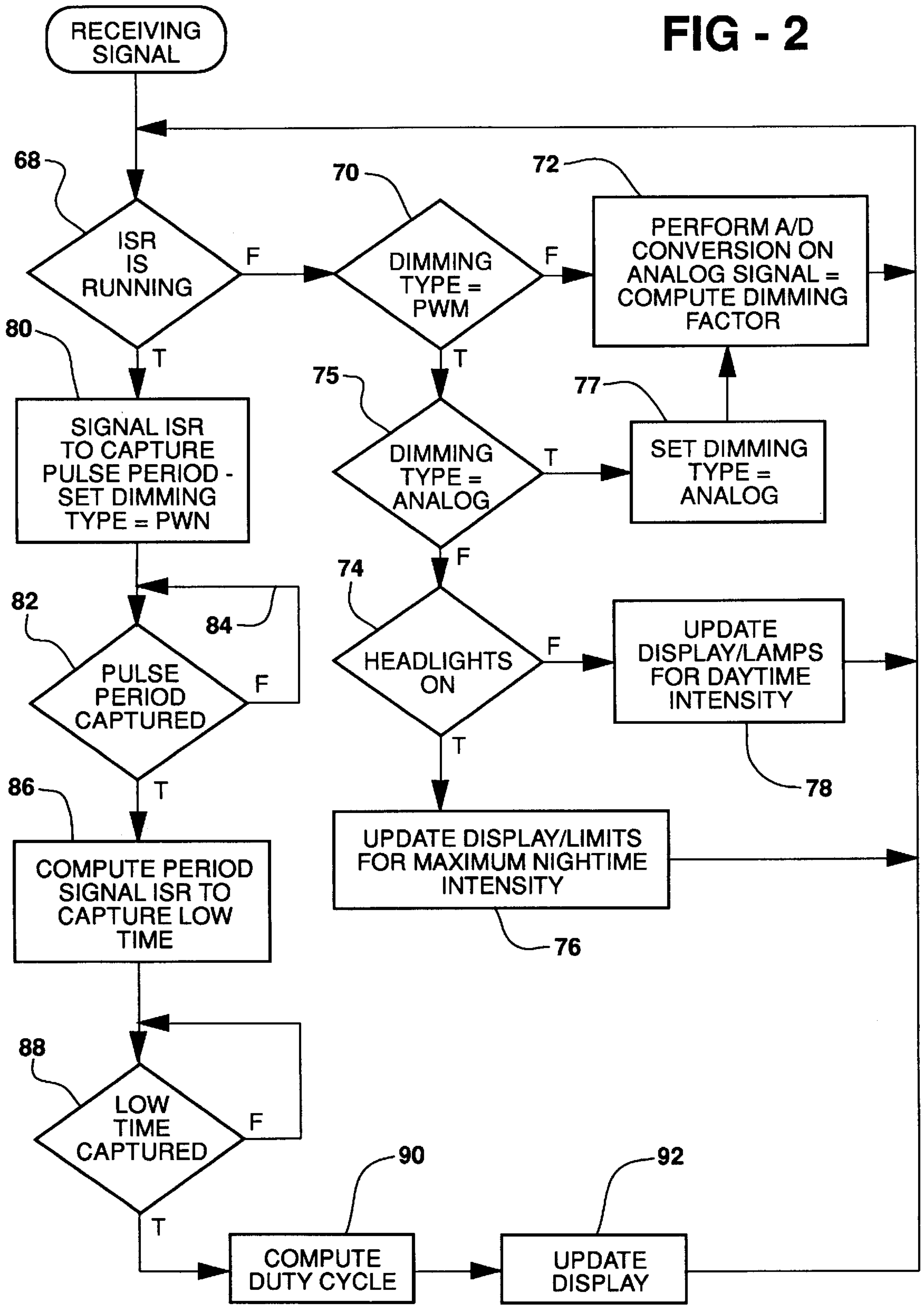
FIG. 2 is a flow chart of one embodiment of a called part of a method of the present invention.

Referring to FIG. 2, a method for dimming a lamp and, more particularly, a vacuum-fluorescent display, is shown. The method continually computes the intensity the vacuum-fluorescent display as a function of the input signal provided by the input circuit 10. The dimming of the vacuum-fluorescent display is continually updated, in real-time, to the intensity level computed. The method is capable of sensing the type of dimming module present by processing the input signals for both types of strategies, i.e., the pulse-width modulated (PWM) and analog to determine the type of dimming used (the "dimming type") Once the dimming type is selected, the corresponding input signal is processed to determine a dimming step, which is then used to compute the brightness of the display. The default type of dimming is to treat the input signal initially as an analog signal. Once a dimming type is selected, it remains selected until the state of the analog and PWM signals exhibit behavior that is unquestionably associated with the other of the two dimming types.

The method begins by receiving a signal at 66. Immediately, it is determined whether the interrupt service routine (ISR) is running at 68. The ISR is shown in detail in FIG. 3 and will be discussed subsequently. One test for determining whether the signal received is an analog signal or a pulse-width signal is by counting a predetermined figure or number of times the ISR has run. In one embodiment, it is determined that a pulse-width modulated signal, either positive or negative, is present if the ISR is executed at least once immediately before a called part of the method (discussed subsequently) is run, for a duration of six consecutive runs of the called part. The default dimming type is analog upon initial powering.

If it is determined that the ISR is not running, it is determined whether the dimming type signal has previously been determined to be a pulse-width modulated signal at 70. If not, the analog-to-digital converter 21 converts the analog input at 72. It is here that the display intensity is computed and updated using a variable dimming factor when the signal received by the input circuit 10 is an analog signal. If it is determined, at 70, that the dimming type is PWM, it is determined if the signal indicates that the headlights are on at 74. It is then determined if the signal cannot be PWM at 75 by testing an analog-to-digital threshold. If a analog-to-digital value falls below the analog-to-digital threshold and a PWM signal does not appear (the appearance of which is due to the duty cycle dropping below 100%), the signal is determined to be analog. The dimming type is then set to analog at 77. After which the analog signal is converted to a digital signal at 72.

Although any type of test may used to determine when a minimum amount of ambient light is present around the motor vehicle and/or the display, the method chosen in the this embodiment is whether the headlights have been turned on. It may be appreciated by those skilled in the art that sensing ambient light directly or sensing other events could determined the amount of ambient light present. If the headlights are turned on indicating a minimum amount of ambient light is present, the display is updated for maximum night time intensity at 76. If not, however, the display is updated using the variable dimming factor for daytime intensity at 78. Regardless of whether the headlights are on or not, once the intensity has been adjusted, the method is immediately returned to determine whether the ISR is running. If it has been determined that the ISR is running at 68, it is determined at 80 that the dimming type signal is a pulse-width modulated signal. If so, the dimming type is set to PWM at this time. The ISR is instructed to capture period values of the pulse-width modulated signal. It is then determined at 82 whether the ISR has captured the period values of the pulse-width modulated signal at 82. A loop 84 insures that the period values of the pulse-width modulated signal are not computed until the ISR has captured the period values. When the ISR has captured the period values, the period of the pulse-width modulated signal is computed at 86. It is also at this time that the ISR is instructed to capture an edge, namely a rising edge in the pulse-width modulated signal. It is determined at 88 whether the ISR has captured the rising edge of the pulse-width modulated signal. When the ISR has captured the rising edge of the pulse-width modulated signal, the duty cycle of the pulse-width modulated signal is calculated at 90. The duty cycle of the pulse-width modulated signal is defined as the amount of time the pulse-width modulated signal is in a low state divided by the time of the whole period. Based on the duty cycle of the pulse-width modulated signal, the display is updated at 92 by updating the variable dimming factor. Because the display is continually updated, the method returns to diamond 68 where it is determined whether the ISR is running.

Figure 3:
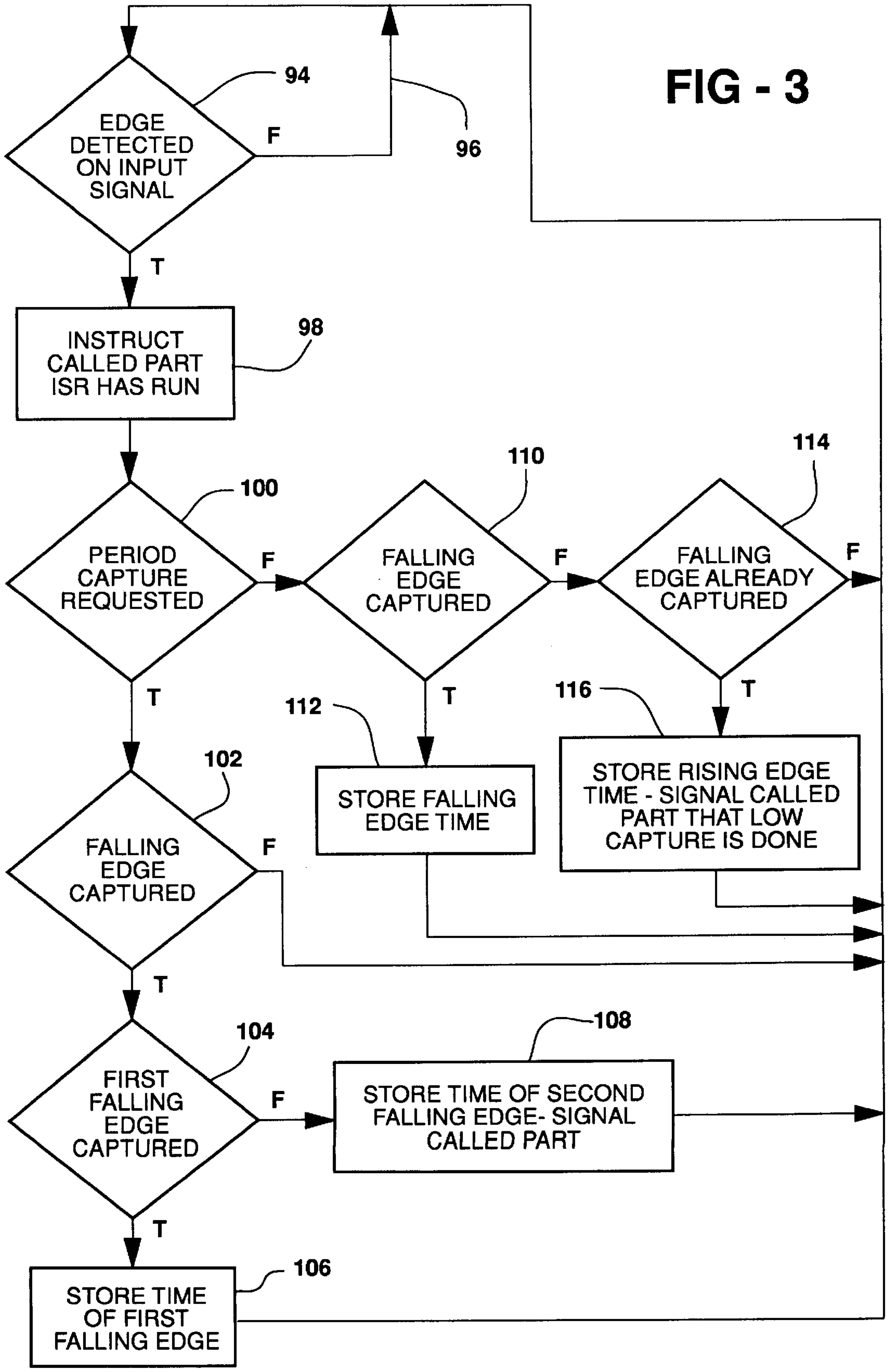
FIG. 3 is a flow chart of one embodiment of an interrupt service routine used in the method of the present invention.

Referring to FIG. 3, the ISR is shown as a closed loop. The ISR is shown as a closed loop because it is constantly running whenever a pulse-width modulated signal is present and power is received by the battery and/or generator system of the motor vehicle. The first portion of FIG. 3 is the detection of an edge on the input signal at 94. If, in the situation where the input signal is an analog signal, the ISR will not be invoked and the first step 98 thereof will not be executed. In a motor vehicle with a pulse-width modulated signal, the ISR, beginning at 98, runs up on the occurrence of each edge. If an edge is detected in the input signal, the ISR notifies the called part, the portion of the method shown in FIG. 2, that the ISR has run at 98. Once the called part, FIG. 2, has been signaled that the ISR has run, it is determined whether a request for a period capture from the called part has been received at 100. If so, it is determined whether a falling edge has been captured at 102. If not, the ISR loops back to determine whether an edge has been detected in the input signal at 94. If so, it is determined whether the falling edge captured is the first falling edge at 104. If the falling edge captured is the first falling edge, the time at which the first falling edge occurred is stored at 106. The ISR is returned to the edge detection test at 94. If the falling edge which is captured is not the first falling edge, the falling edge is determined to be the second or subsequent falling edge of the period at 108. The time at which the second falling edge occurs is stored at 108 and the called part of the method is sent an indication that the period capture has been completed. If it is determined, at 100, that the period capture has not been requested, it is determined at 110 whether a falling edge has been captured. If so, the time in which the falling edge was captured is stored at 112. If not, it is determined whether a falling edge has already been captured at 114. If not, the ISR is looped back to the edge detection test at 94. If, however, the falling edge has already been captured the time at which an intermediate or rising edge is detected is stored at 116. It is at this time that the ISR indicates to the called part of the method that the low time has been captured. The low time, in combination with the period time, is used by the called part of the method at 90 to compute the duty cycle of the pulse modulated signal.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. An input circuit for a dimming circuit control unit having a single input signal protocol, said input circuit comprising:

- a first input line to receive a first input voltage signal;
- a first voltage divider electrically connected to said first input line to receive the first input voltage signal and to divide a first voltage of the first input voltage signal, said first voltage divider having a first output terminal;
- a second input line to receive a second input voltage signal;
- a second voltage divider electrically connected to said second input line, to receive the second input voltage signal and to divide a second voltage of the second input voltage signal, said voltage divider having a second output terminal;
- an OR terminal connecting said first output terminal to said second output terminal;
- an inverter connected between said first voltage divider and said OR terminal to invert said first input voltage signal to eliminate a signal polarity to be received by the dimming circuit control unit; and
- an analog to digital converter electrically connected to said first output terminal of said first voltage divider to convert the first voltage from said first voltage divider when the first input signal is analog such that the dimming circuit control unit always receives a digital signal having the single input signal protocol.

2. A method for dimming a vacuum-fluorescent display using an input circuit, the method comprising the steps of:

- receiving a signal by a first line of the input circuit;
- detecting an edge in the signal;

initiating an interrupt service routine when the edge is detected;

detecting a subsequent edge in the signal;

measuring the time between the edge and the subsequent edge;

identifying when the interrupt service routine has run;

calculating a pulse width defined by the edge and the subsequent edge;

calculating a duty cycle of the pulse width; and updating the vacuum-fluorescent display by updating a dimming factor and dimming the vacuum-fluorescent display.

3. An input circuit as set forth in claim 1 wherein said first voltage divider includes a first capacitive unit to limit frequencies and suppress transients, said first capacitive unit electrically connected between said first input line and said first output terminal.

4. An input circuit as set forth in claim 1 wherein said second voltage divider includes a second capacitive unit to limit frequencies and suppress transients, said second capacitive unit electrically connected between said second input line and said second output terminal.

5. A method for dimming a vacuum-florescent display using an input circuit, the method comprising the steps of:

receiving a signal by a first input line of the input circuit;

detecting an edge in the signal;

detecting a subsequent edge in the signal;

calculating a pulse width defined by the edge and the subsequent edge;

calculating a duty cycle of the pulse width; and updating the vacuum-fluorescent display by updating a dimming factor and dimming the vacuum-fluorescent display with the input circuit.

6. A method set forth in claim 5 wherein the step of calculating the duty cycle includes the step of detecting an intermediate edge in the signal between the edge and the subsequent edge.

7. A method as set forth in claim 6 including the step of determining whether the signal includes pulses defined by the edge, the intermediate edge and the subsequent edge.

8. A method as set forth in claim 7 including the step of measuring an intensity of ambient light.

9. A method as set forth in claim 7 including the step of converting the signal to a digital signal when the signal does not include pulses.

10. A method as set forth in claim 9 including the step of computing the dimming factor based on the digital signal.

11. A method as set forth in claim 2 including the step of counting each time the step of identifying when the interrupt service has run.

12. A method as set forth in claim 11 including the step of identifying the signal as a pulse-width modulated signal when the step of counting exceeds a predetermined figure.

13. A method as set forth in claim 12 including the step of identifying the signal as an analog signal when the step of counting does not exceed the predetermined number.

* * * * *